(12) United States Patent
Higashi et al.

(10) Patent No.: US 7,408,133 B2
(45) Date of Patent: Aug. 5, 2008

(54) METHOD OF THERMALLY COUPLING A FLOW TUBE OR LIKE COMPONENT TO A THERMAL SENSOR AND SENSOR SYSTEMS FORMED THEREBY

(75) Inventors: Robert E. Higashi, Shorewood, MN (US); Ernest A. Satren, Bloomington, MN (US)

(73) Assignee: Honeywell International Inc., Morristown, NJ (US)

( * ) Notice: Subject to any disclaimer, the term of this patent is extended or adjusted under 35 U.S.C. 154(b) by 469 days.

(21) Appl. No.: 11/213,556

(22) Filed: Aug. 26, 2005

(65) Prior Publication Data

US 2007/0044554 A1  Mar. 1, 2007

(51) Int. Cl.
*H05B 1/02* (2006.01)
(52) U.S. Cl. .................. 219/497; 219/483; 219/505; 219/541; 219/553; 338/13; 73/204.25; 374/101
(58) Field of Classification Search .................. 219/497, 219/499, 505, 508, 483–487, 504, 541, 553; 338/13, 25; 73/204.25; 374/101, 107, 20
See application file for complete search history.

(56) References Cited

U.S. PATENT DOCUMENTS

| | | | |
|---|---|---|---|
| 4,651,564 A | 3/1987 | Johnson et al. | ............... 73/204 |
| 5,398,549 A | 3/1995 | Suzuki | |
| 6,794,981 B2 | 9/2004 | Padmanabhan et al. | ....... 338/25 |
| 6,964,204 B2 * | 11/2005 | Clark et al. | ............... 73/861.52 |
| 7,261,824 B2 * | 8/2007 | Schlautmann et al. | .......... 216/2 |

FOREIGN PATENT DOCUMENTS

| | | |
|---|---|---|
| EP | 1351039 A1 | 10/2003 |
| WO | WO 01/20269 A1 | 3/2001 |
| WO | WO 01/84087 A1 | 11/2001 |

* cited by examiner

*Primary Examiner*—Mark H Paschall
(74) *Attorney, Agent, or Firm*—Matthew F. Lambrinos; Luis M. Ortiz; Kermit D. Lopez

(57) ABSTRACT

A method of thermally coupling a flow tube or like component to a thermal sensor comprises bonding the component to the thermal sensor such that thermally conductive portions formed on the component are thermally coupled to corresponding sensing/heating elements disposed on the thermal sensor. The method can be employed to form a capillary mass flow sensor system. Thermally conductive portions, such as metal bands, can be formed on the outer surface of a capillary tube for bonding with corresponding resistive heat sensing and heating elements disposed on the substrate of a micro mass flow sensor. Bonding metal pads can be formed on the sensor surface preparatory to solder bonding the tube metal bands to the resistive sensing and heating elements.

18 Claims, 9 Drawing Sheets

METHOD OF THERMALLY COUPLING A FLOW TUBE OR LIKE COMPONENT TO A THERMAL SENSOR AND SENSOR SYSTEMS FORMED THEREBY

TECHNICAL FIELD

Embodiments are generally related to thermal coupling methods, and in particular, to methods of thermally coupling components to sensors. Embodiments are additionally related to methods of thermally coupling components, such as flow tubes, to thermal sensors of fluids and thermal sensing systems formed thereby. Embodiments are also related to methods of thermally coupling flow tubes to microstructure thermal sensors and micro thermal sensor systems formed thereby.

BACKGROUND OF THE INVENTION

Thermal sensors can be used in a variety of applications to measure heat flux and change in temperature associated with the exchange of heat due to a physical process or activity. If applied in the appropriate manner, thermal sensors can be used to measure other quantities, for example the flow of liquids or gases or the thermal properties of materials. Sensing of mass flow and heat transfer using thermal sensors is for example employed in climate control applications for buildings, temperature control of furnace and oven applications and for monitoring of drying processes.

The term "thermal sensor" is used hereinafter to mean a sensor formed from substrate and having one or more elements disposed thereon for heating and/or sensing properties of a substance or material. A microbridge sensor, for example as detailed in U.S. Pat. No. 4,651,564 to Johnson et al., is an example of such a thermal sensor. The microbridge sensor includes a flow sensor chip which has a thin film bridge structure thermally insulated from the chip substrate. A pair of temperature sensing resistive elements are arranged on the upper surface of the bridge either side of a heater element such that, when the bridge is immersed in the flow stream, the flow of the liquid or gas medium cools the temperature sensing element on the upstream side and promotes heat conduction from the heater element to thereby heat the temperature sensing element on the downstream side. The temperature differential between the upstream and downstream sensing elements, which increases with increasing flow speed, is converted into an output voltage by incorporating the sensing elements in a Wheatstone bridge circuit such that the flow speed of the gas or liquid can be detected by correlating the output voltage with the flow speed. When there is no fluid flow, there is no temperature differential because the upstream and downstream sensing elements are at similar temperatures.

Since the microbridge structure is burst proof, microbridge sensors are suitable for measuring clean gases, with or without large pressure fluctuations. However, the open nature of the microbridge structure can result in condensates from vapor being retained in the microbridge structure leading to uncontrolled changes in thermal response making the sensor measurements susceptible to error and instability. Furthermore, wires bonded to the heater and sensing elements retain particles suspended in the fluid and increase turbulence shifting flow response. Also, the wires are prone to damage in a high mass flux environment and during cleaning of the sensor.

Another example of a thermal sensor is a membrane-based sensor. Membrane sensors do not have an opening exposed to the fluid so that the liquid cannot enter the underlying structure. The membrane sensor enables accurate measurements to be made in harsh environments (condensing vapors, suspended particles, etc.). However, the membrane sensor includes an air gap sealed from the fluid by the membrane making the sensor susceptible to failure in high pressure environments due to deformation or bursting of the membrane. Also, the heating/sensing elements are typically wire bonded to other components and exposed to the fluid flow resulting in possible damage due to high mass flow or cleaning as in the case of the microbridge structure.

Another example of a thermal sensor is a microstructure thermal flow sensor having a microsensor die with a Microbrick™ or microfill structure which sensor is more suited to measuring fluid flow and properties under harsh environmental conditions. The microstructure flow sensor uses a Microbrick™ or microfill forming a substantially solid structure beneath the heating/sensing elements and has a passivation layer isolating the heating/sensing elements from the fluid so that the sensor is less susceptible to the effects of the fluid. Furthermore, the sensor uses through-the-wafer electrical connections instead of wire bonding overcoming problems associated with wire bonding. Although this type of microstructure sensor is capable of reliable, stable and rapid-response operation under harsh environments, the sensor still has limitations for the type of fluid flow environment in which the sensor can be used. Also, the microstructure can perturb the flow stream characteristics within the fluid so that the sensor cannot be used effectively.

The aforementioned problems demonstrate that there is a need to provide a thermal sensor system which is capable of accurately and reliably measuring properties of a fluid whilst achieving good chemical isolation from and minimal perturbation of the fluid.

BRIEF SUMMARY OF THE INVENTION

The following summary of the invention is provided to facilitate an understanding of some of the innovative features unique to the present invention and is not intended to be a full description. A full appreciation of the various aspects of the invention can be gained by taking the entire specification, claims, drawings, and abstract as a whole.

It is, therefore, one aspect to provide a method of forming an improved thermal sensor system It is another aspect, to provide for a thermal sensor system for measuring the properties of a fluid which can be utilized satisfactorily without perturbing the fluid.

It is another aspect to provide a method of forming an improved micro mass flow sensor system.

It is a further aspect of the present invention to provide a micro mass flow sensor system suitable for use in a variety of mass flow applications including harsh environments.

The aforementioned aspects of the invention and other objectives and advantages can now be achieved as described herein. Methods of thermally coupling components, such as flow tubes, to thermal sensors are disclosed. The thermal sensor systems formed thereby are capable of effectively measuring the properties of fluid enclosed or passing through the component without perturbing the fluid flow characteristics.

The method of thermally coupling a flow tube or like component to a thermal sensor involves bonding the component to the thermal sensor such that the heat sensing/heating element(s) disposed on a surface of the sensor can be thermally coupled to a corresponding location on the component surface. Bonding the component to the thermal sensor surface provides a secure mechanical connection therebetween which is less susceptible to failure compared to coupling by means of other techniques such as by wire bonding the elements to the component.

A plurality of thermally conductive attachment portions can be formed on the component surface for alignment with separate corresponding sensing/heating elements disposed on the thermal sensor surface. Thermally conductive bonding material can be applied on the sensing/heating elements and/or the attachment portions. The component can be aligned on the sensor by aligning the component attachment portions to the corresponding sensing/heating elements. The component can be bonded to the thermal sensor such that component attachment portions are thermally coupled to the separate corresponding heat sensing/heating elements. The sensing/heating elements can be bonded to the corresponding component portions or can be in direct contact therewith. Separately bonding each temperature heating/sensing element to a corresponding component attachment portion provides precise heat conduction paths between the elements and designated locations on the component thereby enabling highly efficient and controlled heat exchange between the component and sensor. A more reliable means of thermally coupling the component to the thermal sensor is therefore provided and more accurate and reliable sensing can be achieved.

Two or more attachment points can be formed on the thermal sensor spaced apart either side of the sensing element for further aligning the component on the thermal sensor surface. Bonding the component attachment portions to the corresponding attachment points facilitates alignment of the tube across the planar surface.

The thermal sensor can be formed as a microstructure having at least one heating sensing element disposed on the surface of the microstructure for sensing at least one intrinsic or extrinsic property. The microstructure can have a plurality of heat sensing/heating elements disposed thereon.

The thermal micro sensor can be for example a microstructure flow sensor having a Microbrick™ or microfill structure forming a substantially solid structure beneath the heating/sensing element(s). Thermally conductive bonding pads or layers can be deposited on sensing/heating elements of the microstructure flow sensor for adhering the elements to the bonding material. The bonding pads can be formed for example by depositing nickel layers on the sensing/heating elements and then depositing gold layers on the nickel layers.

Solder can be selected as the bonding material. The component can be bonded to the microstructure flow sensor by soldering the component attachment portions to the corresponding bonding pads. The solder can be deposited on the bonding layer(s) by lift-off or shadow mask techniques. A solder reflow process can be affected subsequent to bonding the flow tube to the microstructure. The solder reflow is advantageous in that it self-aligns the component attachment portions to the attachment areas such that the tube is correctly aligned on the microstructure.

Forming the bonding pads, solder pads and component attachment portions from metals, or other materials having high thermal conductivity, enables the sensing and heating elements to be efficiently thermal coupled to the flow tube.

The component can be a capillary flow tube. Partial or complete thermally conductive bands can be formed on the tube outer surface and concentric with the tube for alignment with the bonding pads or layers.

Each bonding pad can be formed using a split deposition technique in which the bonding pad is patterned as a pair of pads spaced apart side by side such that a gap extends therebetween in the flow direction. When the tube is bonded to the bonding pads, the lower most part of the tube circular cross-section can sit in the gaps formed in the bonding pads. Forming gaps in the deposited bonding material in this manner facilitates locating the flow tube perpendicular to the flow direction preparatory to final bonding of the tube to the pads.

A thermal micro flow sensor system can be formed by the method of thermally coupling a capillary flow tube to a thermal micro mass flow sensor. The system can include a microstructure flow sensor having a having a Microbrick™ or microfill structure. An upstream and downstream resistive heat sensing elements can be disposed either side of a heating element. A capillary flow tube is bonded to the microstructure. The flow tube has formed thereon thermally conductive areas for alignment with the corresponding sensing and heating elements of the microstructure. The thermally conductive areas can be bonded on corresponding sensing and heating elements by means of thermally conductive material such that the sensing and heating elements are thermally coupled to separate areas on the capillary tube. The method of thermally coupling the capillary tube to the mass flow sensor by bonding the tube to the thermal sensor surface can provide a reliable capillary mass flow system which is suitable for use in harsh environments.

The thermal flow sensor system can include metal bonding pads formed on the sensing and heating elements and bonded to the tube thermally conductive areas. The metal bonding pads can be a nickel layer and a gold layer deposited thereon. The thermally conductive areas of the tube can be bonded to the metal bonding pads by means of a soldering process.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION OF THE INVENTION

The particular values and configurations discussed in these non-limiting examples can be varied and are cited merely to illustrate at least one embodiment of the present invention and are not intended to limit the scope of the invention.

Figure 1:
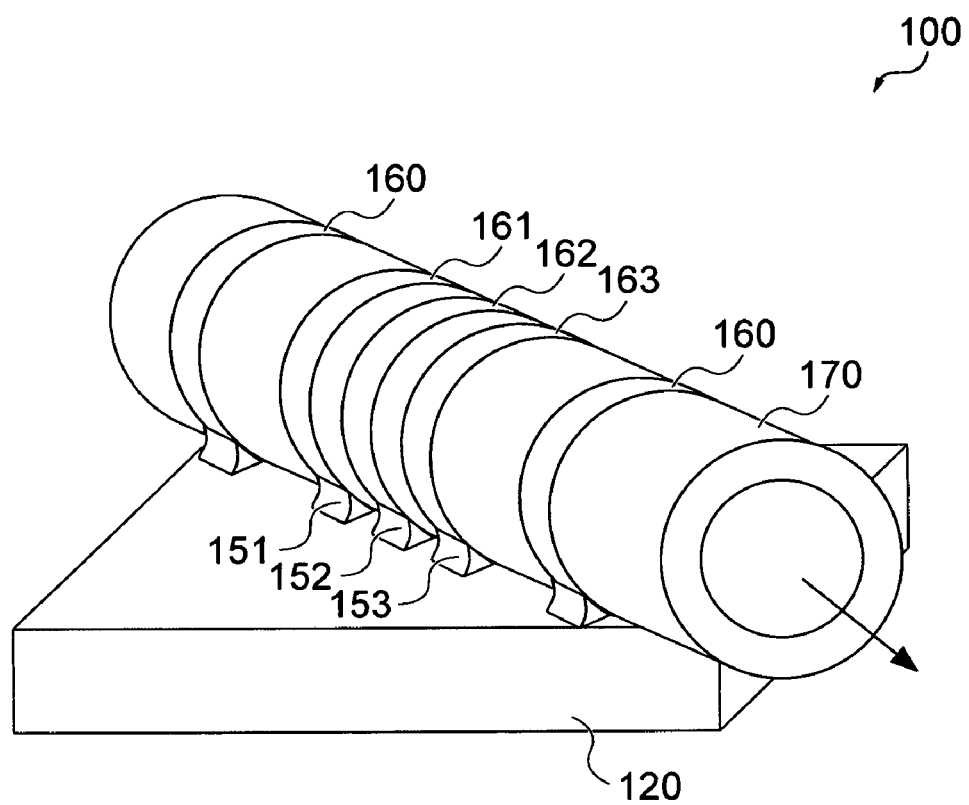
FIG. 1 illustrates a perspective view of a thermal flow sensor system formed by a method of thermally coupling a flow tube to a thermal sensor in accordance with a preferred embodiment.

Referring to FIG. 1 of the accompanying drawings, a thermal mass flow sensor system 100 is depicted, which can be formed by a method of thermally coupling a component 170 in the form of a flow tube to a thermal sensor 120 in accordance with a preferred embodiment.

In the embodiment of the thermal sensor system shown in FIG. 1, the thermal sensor 120 consists of a microstructure thermal flow sensor having a microsensor die with a Microbrick™ or microfill structure, such as detailed in U.S. Pat. No. 6,794,981 to Padmanabhan et al. which is incorporated herein by reference. The component 170 consists of a capillary flow tube formed from a chemically inactive material, such as glass, such that chemical contamination between the tube and fluid passing through the tube is minimized.

However, those skilled in the art would understand that the illustration of FIG. 1 is merely depicting one example of the embodiments and that the embodiments are not limited thereto. The component 170 may be any type of conduit, compartment, chamber or other suitable vessel for transporting heat by thermal conduction to a thermal sensor. Furthermore, the flow tube or other like component 170 can be thermally coupled to any type of thermal sensor formed from a substrate having at least one heat sensing element disposed thereon capable of sensing heat or temperature from the component thermally coupled to the sensor.

Figure 3:
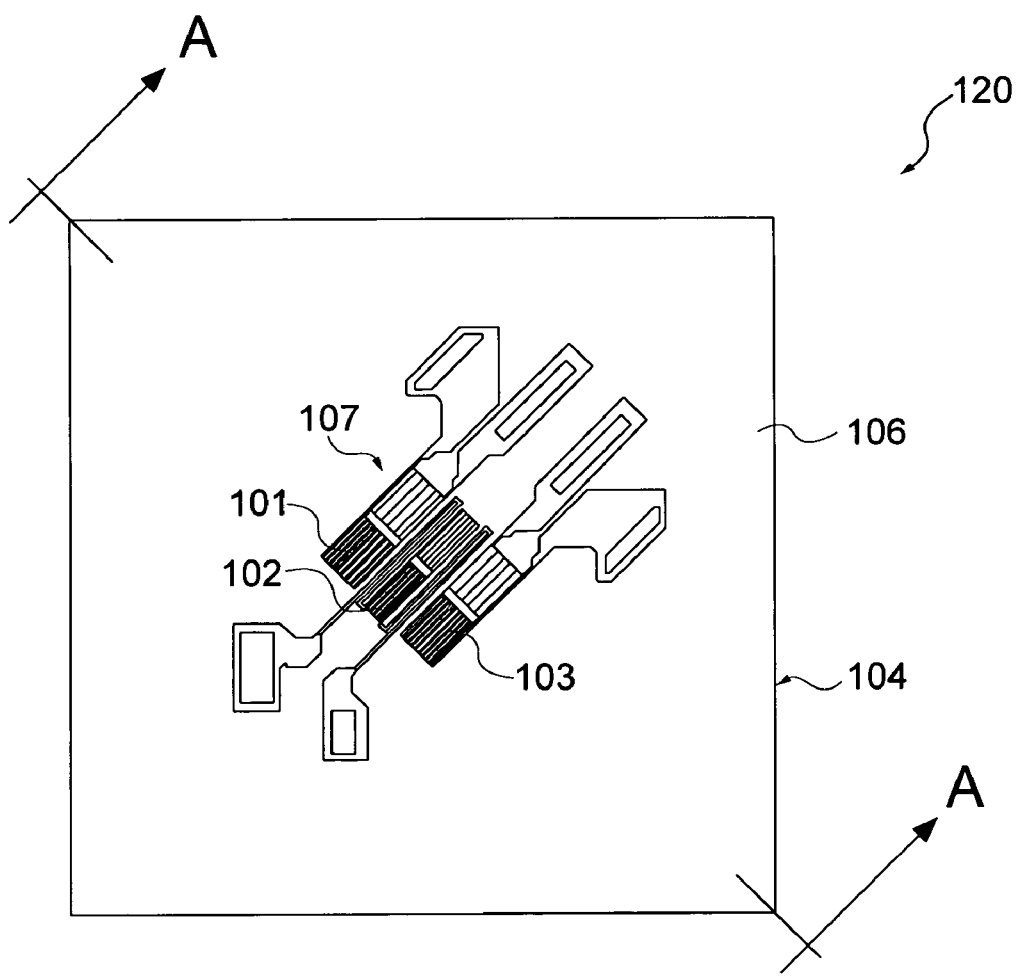
FIG. 3 illustrates a plan view of a flow sensor micro chip prior to implementing the method of thermally coupling the flow tube thereto according to a preferred embodiment.
Figure 4:
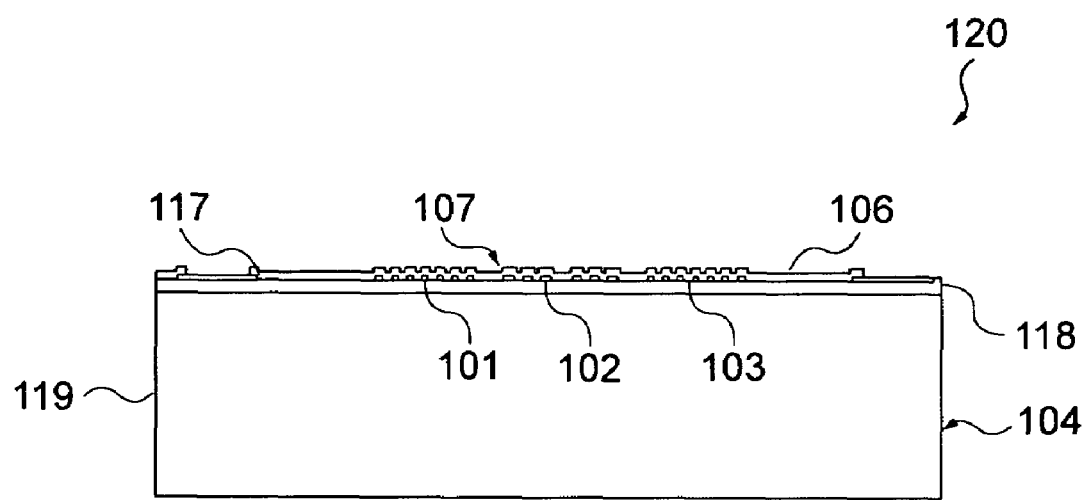
FIG. 4 illustrates a cross-sectional view taken along line A-A of the sensor chip of FIG. 2.

FIG. 3 illustrates a plan view of the microstructure sensor 120 of the thermal sensor system of FIG. 1, and FIG. 4 illustrates a cross-sectional view taken along line A-A of FIG. 3. The microstructure sensor 120 consists of a flow fluid sensor die or substrate 104 having a body 119. A pair of temperature sensing resistive elements 101, 103 together with a heating resistive element therebetween 102 is arranged spaced apart on the body. The elements 101, 102, 103 are formed from a suitable metal, such as platinum.

Body 119 can be implemented in the form of a Microbrick™ or microfill structure that may be composed of a glassy block of material having a low thermal conductivity, such as Pyrex or quartz, which provides a substantially solid structure beneath the heating/sensing elements 101, 102, 103 other than conductive vias (not shown) electrically interconnecting elements to other components. Upon the upper surface of the glass body is a passivation layer 118, such as for example silicon nitride ($Si_3N_4$), on which the heating/sensing elements 101, 102, 103 are disposed. A protective layer 117, also formed for example from silicon nitride, is disposed on the heating/sensing elements.

Thermally conductive attachment portions 161, 162, 163 formed spaced apart about the exterior of the flow tube and concentric with the tube, are bonded to corresponding resistive sensing/heating elements 101, 102, 103 (See FIGS. 1 & 8) so that heat can be exchanged between the flow tube 170 and thermal sensor 120 in an efficient and precise manner by means of separate heat conduction paths between the sensing/heating elements and the corresponding thermally conductive attachment portions. The resulting thermal sensor system is capable of effectively measuring fluid flow despite the thermal sensor 120 being separated from the fluid flow. Advantageously, the fluid flow is unaffected by the thermal sensor 120.

A method of thermally coupling a component to a thermal sensor according to one embodiment to form a thermal mass flow system, for example as shown in FIG. 1, will now be described with reference to the flow diagram of FIG. 9.

Figure 9:
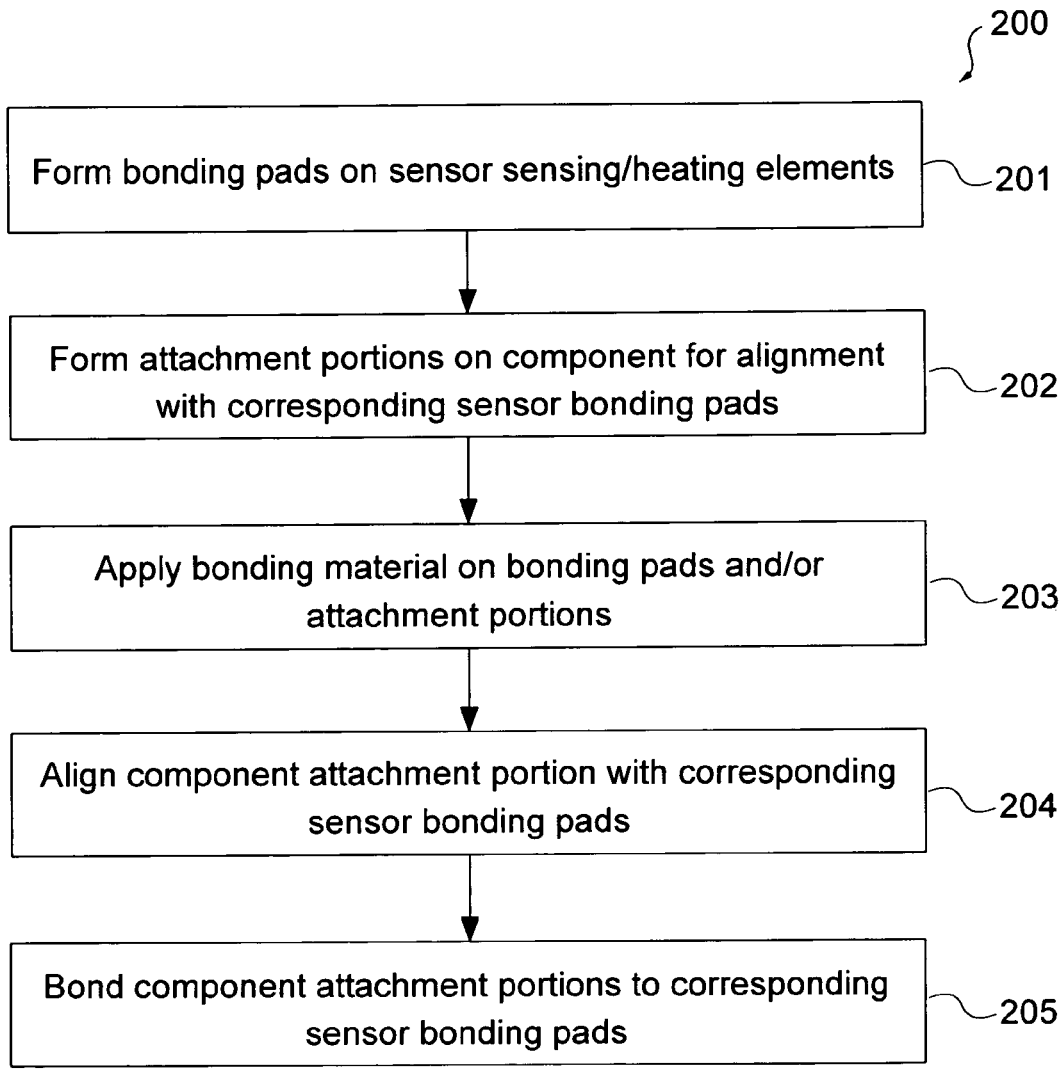
FIG. 9 illustrates a flow diagram of a general method of thermally coupling a component to a thermal sensor according to one embodiment.

As indicated in block 201 of FIG. 9, preparatory to depositing bonding material on the sensor resistive sensing/heating elements, bonding pads or layers are deposited on the elements such that the elements can adhere to the bonding material. For example, in order to form the thermal sensor of FIG. 1, initially, bonding pads 111, 112, 113 are deposited on the upper surface of the protective layer 117 above respective sensing and heating elements 101, 102, 103 of thermal sensor 120 as shown in FIGS. 5 & 6 which illustrate plan and cross-sectional views of the resulting microstructure following deposition of the bonding pads.

The bonding pads 111, 112, 113 are formed from a material which has a high thermal conductivity and which has adhesion properties which are suitable for adhering the sensing/heating elements 101, 102, 103 to a selected bonding material. For example, in order to bond the flow tube 170 to the sensor 120 by means of a solder process, the bonding pads 111, 112, 113 are formed by depositing a nickel layer on the elements 101, 102, 103 followed by a gold layer thereon for solder wetting. Additional bonding pads 110 are formed on the substrate surface 106 at or adjacent two diagonally opposing corners of the substrate and in alignment with the elements to facilitate self-alignment of the flow tube 170 on the planar surface 106 of the sensor 120. However, bonding pads 110 are not essential for the purpose of bonding the tube 170 to the sensor 120.

Figure 2:
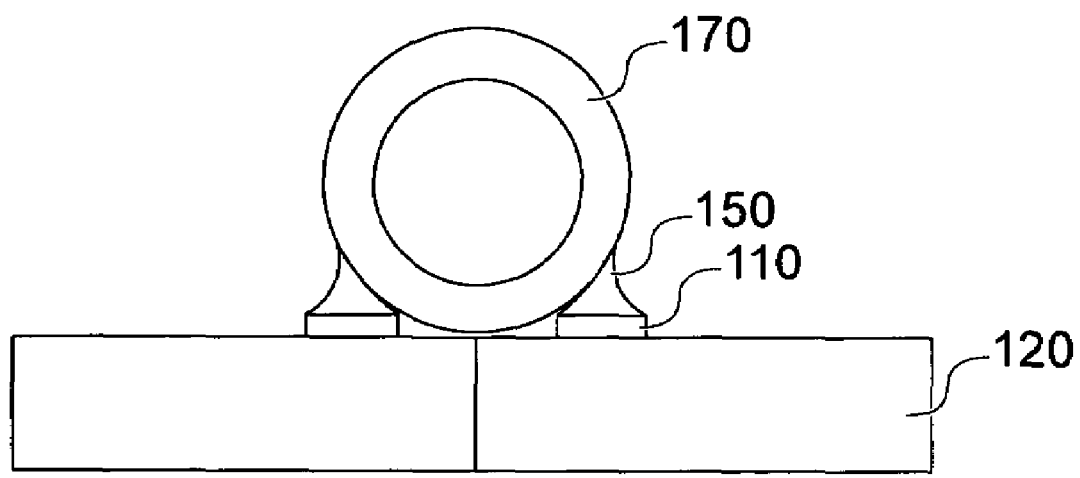
FIG. 2 illustrates a side view of the thermal flow sensor looking in the flow direction of the flow tube of FIG. 1.
Figure 5:
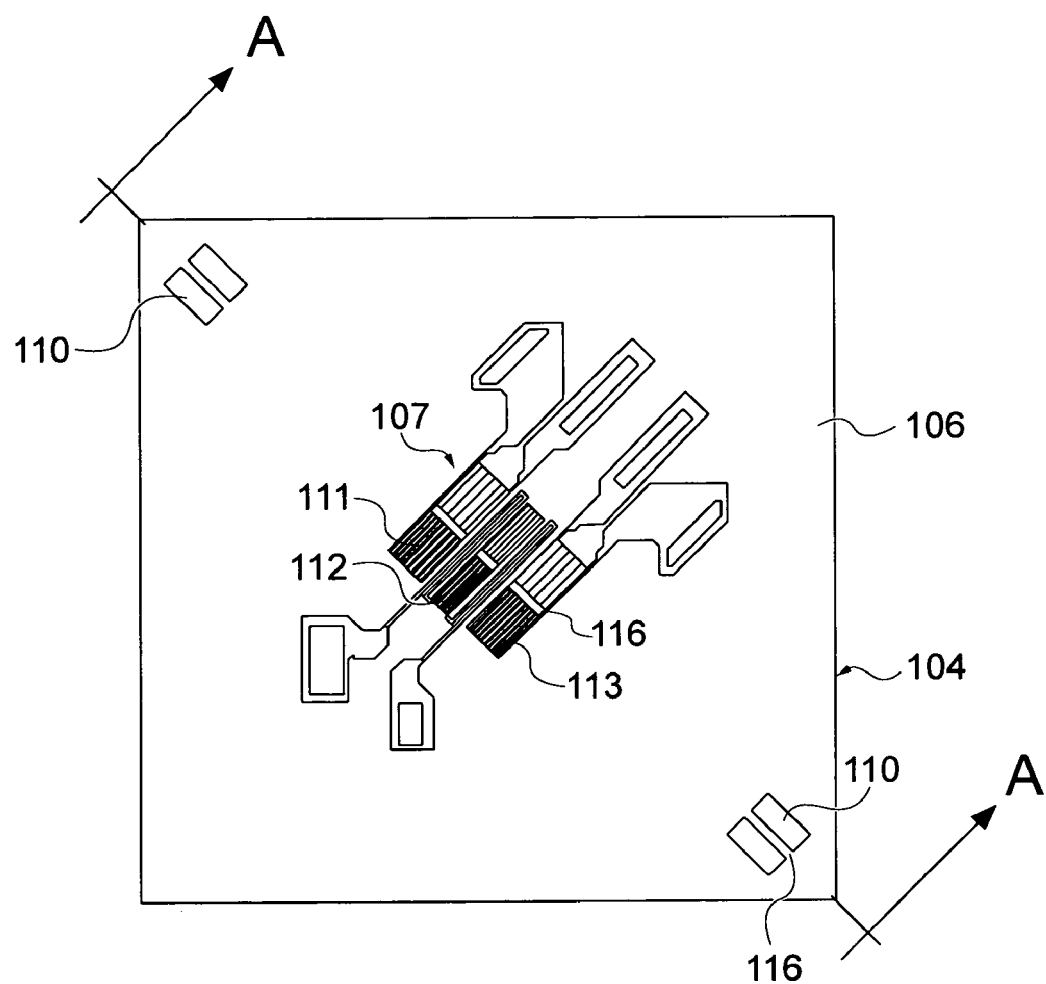
FIG. 5 illustrates a plan view of a flow sensor micro chip following the method step of depositing bonding pads on the sensor.
Figure 6:
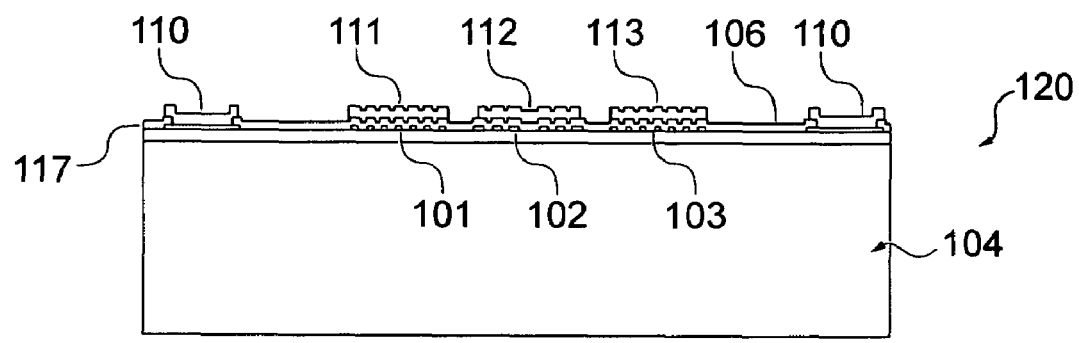
FIG. 6 illustrates a cross-sectional view taken along a line A-A of the sensor structure of FIG. 5.

In the example shown in FIGS. 5 & 6, each bonding pad 110-113 is formed by means of a split deposition or patterning technique in which a pair of pads are deposited spaced apart and side by side on the sensor surface 106 such that a gap 116 extends longitudinally therebetween. Patterning the bonding pads 110-113 with gaps 116 in this manner permits the flow tube 170 to be placed along the upper surface 106 of the sensor with the lower most portion of the circular cross section of the tube seated in the gaps (see FIG. 2). Alternatively, the bonding pads can be formed without gaps in cases in which alignment is less critical.

As indicated in step 202 of FIG. 9, high thermal conductivity attachment portions are formed on the outer surface of the component in alignment with corresponding sensing elements. In the example of the thermal sensor system shown in FIG. 1, attachment portions 160, 161, 162, 163 are formed on the outer surface of the flow tube 170 for alignment with respective solder pads 150, 151, 152, 153 (see FIGS. 1 and 8). Formation of the solder pads will be described in more detail below. Tube attachment portions 160, 161, 162, 163 are formed by affixing metal bands to the tube outer surface and concentric with the tube. However, attachment portions formed from high thermally conductive materials other than metal can be utilized in conjunction with the appropriate bonding material.

Step 202 need not be performed after step 201 and can be performed at any time preparatory to bonding the component to the sensor. Furthermore, step 202 can be omitted in cases in which the component is itself formed from metal or other highly conductive material and the component may be bonded directly to the bonding pads.

Figure 7:
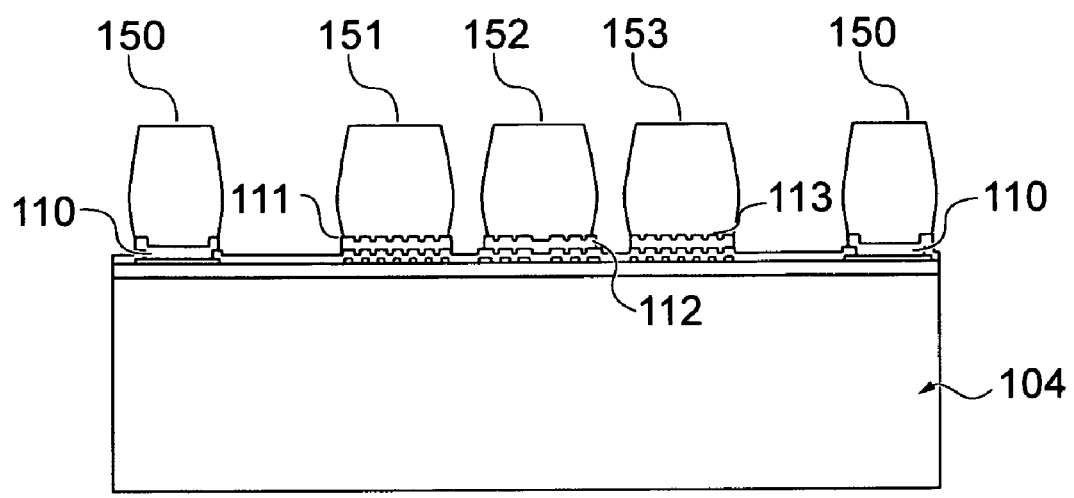
FIG. 7 illustrates a cross-section view of the flow sensor following the method step of depositing solder pads.

Subsequent to forming the bonding pads, a bonding material is applied to the bonding pads and/or to the attachment portions, as indicated in step 203 of FIG. 9. In order to thermal coupling the flow tube 170 to the sensor 120 as shown in FIG. 1, a highly thermally conductive bonding material, in this case solder, such as indium or indium lead, is subsequently deposited on the bonding pads 110, 111, 112, 113 as indicated in FIG. 7, which illustrates a cross-sectional view of the resulting microstructure flow sensor following solder deposition. The solder deposition is performed by means of lift-off or shadow mask techniques, such as those employed in integral vacuum packaging technology, to form solder pads 150, 151,152,153 for subsequent soldering to the flow tube. For example, lift-off techniques common to the semiconductor industry and capable of applying 5-10 micrometers of material could be used, such as 2-level resist lift-off, or image reversal lift-off. Shadow masking could similarly be used, but generally has less precision. Both lift-off and shadow masking would allow the patterning of a highly thermally conductive bonding material without having to etch the bonding material itself, but rather remove the unwanted material by removing the shadow mask or dissolving the lift-off resist.

As indicated in step 204 of FIG. 9, the component attachment portions are then aligned with the corresponding bonding pads. In the example of the thermal sensor system of FIG. 1, the metal bands 160, 161, 162, 163 are aligned with corresponding split solder pads 150, 151, 152, 153. The lowermost portion of the tube circular cross section is seated in the longitudinal gaps 116 formed in the solder pads facilitating alignment of the length of the tube 170 along the upper surface 106 of the sensor 120 and perpendicular to the flow direction before the final soldering process (see FIG. 2).

Thereafter, as indicated in step 205 of FIG. 9, the attachment portions are bonded to the corresponding bonding pads. In the case of the thermal sensor system of FIG. 1, the metal bands 160, 161, 162, 163 are solder bonded to the corresponding solder pads 150, 151, 152, 153, if necessary, using flux which can be cleaned off after soldering, thereby bonding the flow tube 170 to the microsensor 120 (see FIG. 8).

A solder reflow process can be affected subsequent to bonding the flow tube 170 to the sensor 120. The solder reflow process is advantageous in that the solder surface tension during reflow helps self-align the tube bands 161, 162, 163 to the solder pads 151, 152, 153 such that the tube is correctly aligned along the sensor upper surface 106 but the reflow process is not essential for bonding the tube to the sensor.

Forming the bonding pads and attachment portions from metals, or other materials having high thermal conductivity, enables the sensing and heating elements to be efficiently thermal coupled to the flow tube or like component.

Moreover, separately bonding each temperature heating/sensing element to a corresponding tube metal band, as in the example of the thermal sensor system of FIG. 1, provides precise heat conduction paths between the sensing and heating elements and precise locations on the flow tube thereby enabling efficient and controlled heat exchange between the flow tube and sensor. A more reliable means of thermally coupling the flow tube to the thermal sensor is therefore provided and more accurate and reliable sensing can be achieved.

Additionally, bonding the metal bands to the flow tube provides a secure mechanical connection therebetween which is less susceptible to failure compared to elements connected to flow tubes by known means, such as by metal wires wound around the flow tube.

Figure 8:
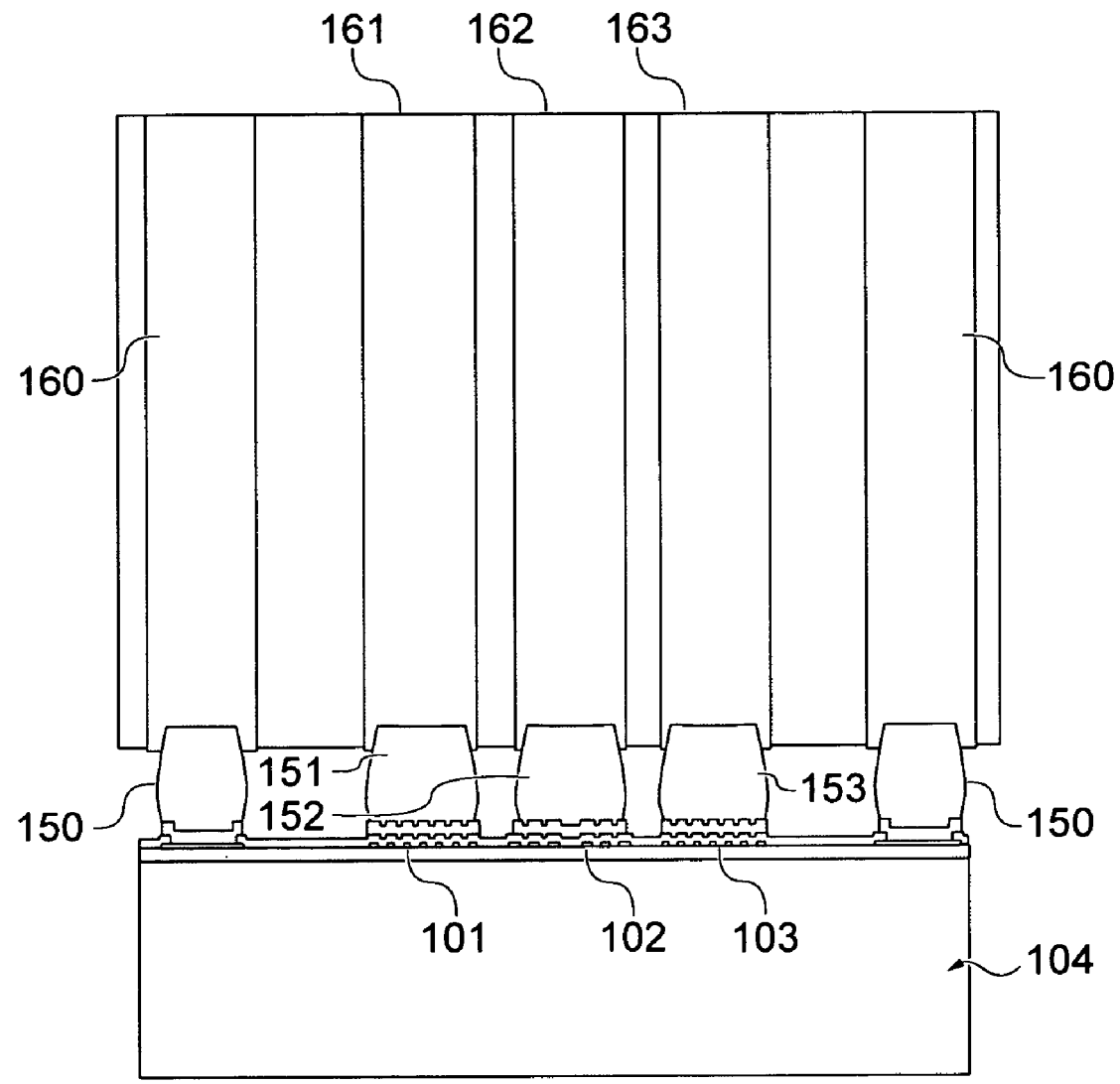
FIG. 8 illustrates a cross-sectional view of the flow sensor following the method step of soldering the flow tube bands to the solder pads.

The method of operation of the thermal flow sensor system 100 formed by the method of thermally coupling a capillary tube 170 to the thermal sensor 120 according to the one embodiment will now be described with reference to the system shown in FIGS. 1 and 8. In operation, when there is no fluid flow, the upstream and downstream sensing elements 101, 103 are at similar temperatures so that there is no temperature differential between the elements 101, 103. However, when fluid is passed through the capillary tube, the fluid flow cools the temperature sensing element 101 on the upstream side and promotes heat conduction from the heater element 102 to thereby heat the temperature sensing element 103 on the downstream side. The temperature differential between the upstream and downstream sensing elements, which increases with increasing flow speed, is converted into an output voltage by incorporating the sensing elements in a Wheatstone bridge circuit (not shown) such that the flow speed of the gas or liquid can be detected by correlating the output voltage with the flow speed. The capillary tube 170 chemically isolates the fluid from the thermal sensor 120 and enables measurement of the flow rate without perturbation of the liquid. The method of thermally coupling the tube to the thermal sensor according to the embodiment therefore provides a reliable and reproducible micro mass flow system which is suitable for use in harsh environments.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered.

For example the skilled person would understand that the method of thermally coupling a component to a thermal sensor can be implemented using components having a non-linear form, such as a U-shaped tube, rather than a linear form like the tube of the described embodiments. Furthermore, the skilled person would understand that the sensing/heating elements can be thermally coupled to the component attachment portions, such as the flow metal bands shown in FIG. 1, by bonding the flow tube to attachment points located away from the sensing/heating elements such that the attachment portions are in direct contact but not bonded to the corresponding sensing/heating elements.

The description as set forth is not intended to be exhaustive or to limit the scope of the invention. Many modifications and variations are possible in light of the above teaching without departing from the scope of the following claims. It is contemplated that the use of the present invention can involve components having different characteristics. It is intended that the scope of the present invention be defined by the claims appended hereto, giving full cognizance to equivalents in all respects.

The embodiments of the invention in which an exclusive property or right is claimed are defined as follows.

Having thus described the invention what is claimed is:

1. A method of thermally coupling a component to a thermal sensor comprising:

applying a bonding material to the thermal sensor, wherein said thermal sensor comprises a microstructure having a plurality of heat sensing/heating elements disposed on the surface of said microstructure, affixing a plurality of separate thermally conductive bands to the outer surface of said component, said thermally conductive bands being separated from one another, substantially concentric with said component, and formed for alignment with the corresponding heat sensing/heating elements disposed on said microstructure surface, aligning said separated thermally conductive bands on said component to the corresponding heat sensing/heating elements, and bonding said separated thermally conductive bands affixed to said component to said heat sensing/heating elements such that said thermally conductive bands are thermally coupled to said corresponding heat sensing/heating elements.

2. The method claim 1, further comprising depositing thermally conductive bonding pads or layers on respective sensing/heating elements of said sensor for adhering said elements to said bonding material.

3. The method of claim 2, further comprising forming additional thermally conductive bonding pads at or adjacent diagonally opposing corners of said microstructure and away from and in alignment with said sensing/heating elements for bonding to corresponding component thermally conductive bands.

4. The method of claim 3, wherein forming said bonding pads comprises
depositing nickel layers on said sensing/heating elements, and depositing gold layers on said nickel layers.

5. The method of claim 3, wherein bonding the component to the sensor comprises solder bonding said component thermally conductive bands to said respective bonding pads.

6. The method of claim 3, wherein said component comprises a flow tube, and wherein forming each bonding pad comprises depositing a pair of pads spaced apart such that a gap extends therebetween and whereby, when said tube is bonded to said bonding pads, the lower most part of the tube cross-section is seated in said gaps.

7. The method of claim 1, wherein said thermal sensor comprises a microstructure sensor having a microbrick or microfill structure providing a substantially solid structure beneath said heating/sensing element(s).

8. The method of claim 7, wherein said component comprises a capillary flow tube.

9. The method of claim 1, wherein said component comprises a flow tube, and
further comprising depositing thermally conductive bonding pads or layers on respective sensing/heating elements of said sensor for adhering said elements to said bonding material,
wherein bonding the flow tube to the sensing/heating elements comprises solder bonding the separated thermally conductive bands to said respective bonding pads;
further comprising solder reflowing, subsequent to bonding the flow tube to the sensing/heating elements, in order to self-align the thermally conductive bands to the bonding pads such that the flow tube is correctly aligned on the microstructure.

10. The method of claim 9, further comprising
forming at least two attachment points spaced apart either side of said sensing element(s) for further aligning said flow tube along said thermal sensor surface,
forming at least two thermally conductive bands separated from one another on said flow tube surface and concentric with said tube for alignment with said attachment points,
applying bonding material to said attachment points,
aligning said thermally conductive bands to said corresponding attachment points and
bonding said at least two thermally conductive bands to said corresponding attachment points.

11. A method of forming a thermal flow sensor system comprising
providing a thermal sensor having upstream and downstream sensing elements and a heating element disposed on the upper surface of a substrate,
providing a capillary tube,
affixing thermally conductive metal bands to the surface of the capillary tube, said metal bands being separated from one another and substantially concentric with said capillary tube for alignment with the corresponding sensing and heating elements on said sensor bridge,
applying thermally conductive bonding material on said sensing and heating elements and/or said tube metal bands
aligning said metal bands with said corresponding sensing and heating elements to align said tube on the surface of said substrate, and
bonding said separated metal bands to said corresponding sensing and heating elements such that said capillary tube is thermally coupled to said heating/sensing element(s).

12. The method of claim 11, further comprising forming metal bonding pads on said sensing and heating elements and at or adjacent diagonally opposing corners of said microstructure away from and in alignment with said sensing/heating elements preparatory to bonding said metal bands to said corresponding bonding pads.

13. The method of claim 12, where bonding said tube metal bands comprises solder bonding said tube metal bands to respective said bonding pads.

14. The method of claim 13, further comprising solder reflowing, subsequent to bonding the capillary tube to the microstructure, in order to self-align the metal bands to the respective bonding pads such that the tube is correctly aligned on the microstructure.

15. A thermal flow sensor system comprising
a thermal sensor comprising a substrate and at least one heating and sensing element disposed on said substrate for sensing properties of a fluid,
a capillary flow tube bonded to said thermal sensor, said flow tube having a plurality of metal bands affixed thereon separated from one another and substantially concentric with said flow tube for alignment with a corresponding said sensing or heating element,
wherein said metal bands affixed to said tube are separately bonded to said substrate by means of thermally conductive material such that said sensing and heating elements are thermally coupled to specific separate areas of said capillary tube.

16. The system of claim 15, sensor wherein said thermal sensor further comprises an upstream sensing element, a down stream sensing element, and a resistive heating element disposed between said upstream and down stream sensing elements, said metal bands affixed to said tube being separately bonded to said upstream and downstream sensing elements and said heating element.

17. The system of claim 15, wherein said substrate a microbrick or microfill structure providing a substantially solid structure beneath said heating/sensing element(s).

18. The system of claim 15, further comprising one or more metal bonding pads formed on said sensing and heating element(s) and wherein said metal bands affixed to said tube are bonded to said metal pads.

* * * * *